United States Patent
Joo et al.

(10) Patent No.: US 8,936,958 B2
(45) Date of Patent: Jan. 20, 2015

(54) METHOD OF MANUFACTURING ORGANIC LIGHT EMITTING DISPLAY APPARATUS

(71) Applicant: Samsung Display Co., Ltd., Yongin, Gyeonggi-do (KR)

(72) Inventors: Sung-Joong Joo, Yongin (KR); Seog-Soon Baek, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/906,753

(22) Filed: May 31, 2013

(65) Prior Publication Data

US 2014/0154824 A1     Jun. 5, 2014

(30) Foreign Application Priority Data

Nov. 30, 2012 (KR) .................... 10-2012-0138520

(51) Int. Cl.
    *H01L 51/40*     (2006.01)
    *H01L 51/00*     (2006.01)
    *H01L 51/50*     (2006.01)
    *H01L 51/56*     (2006.01)
    *H01L 27/32*     (2006.01)

(52) U.S. Cl.
    CPC ........ *H01L 51/0005* (2013.01); *H01L 51/5088* (2013.01); *H01L 51/56* (2013.01); *H01L 27/3211* (2013.01)

USPC ................................................ 438/34; 438/99

(58) Field of Classification Search
    USPC ................................................ 438/34, 22, 99
    See application file for complete search history.

(56) References Cited

U.S. PATENT DOCUMENTS 6,821,553 B2     11/2004     Miyashita et al.

FOREIGN PATENT DOCUMENTS

| JP | 2012-61337 | 3/2012 |
|---|---|---|
| JP | 2012-61377 | 3/2012 |
| KR | 10-2003-0070627 | 9/2003 |
| KR | 10-2004-0096539 | 11/2004 |
| WO | WO 2012/036093 | 3/2012 |

*Primary Examiner* — Reema Patel
(74) *Attorney, Agent, or Firm* — Knobbe Martens Olson & Bear LLP (57) ABSTRACT

A method of manufacturing an organic light emitting display apparatus includes preparing a substrate having a pixel electrode and a pixel defining layer exposing the pixel electrode, forming a hole injection layer (HIL) on the substrate to cover the pixel electrode and the pixel defining layer, forming a primer layer on the HIL, patterning the primer layer to leave a region corresponding to at least a portion of the pixel electrode, removing a portion of the HIL to expose an outer portion of the substrate, and forming an opposing electrode to cover the HIL and the outer portion of the substrate.

21 Claims, 10 Drawing Sheets

METHOD OF MANUFACTURING ORGANIC LIGHT EMITTING DISPLAY APPARATUS

CROSS-REFERENCE TO RELATED APPLICATIONS

This application claims the benefit of Korean Patent Application No. 10-2012-0138520, filed on Nov. 30, 2012, in the Korean Intellectual Property Office, the disclosure of which is incorporated herein in its entirety by reference.

BACKGROUND

1. Field

The present disclosure relates to a method of manufacturing an organic light emitting display apparatus.

2. Description of the Related Technology

Among display devices, an organic light emitting display apparatus has attracted much attention as an advanced display device because it has a wide viewing angle, a high contrast ratio, and a high response speed.

A typical organic light emitting display apparatus has a stack structure in which an emission layer (EML) is inserted between an anode and a cathode so that holes and electrons injected from the anode and the cathode recombine in the EML to emit light. In some such apparatuses, an additional layer, such as an electron injection layer (EIL), an electron transport layer (ETL), a hole transport layer (HTL), and a hole injection layer (HIL), may be selectively inserted between each of the anode and the cathode and the EML.

The EML and the additional layer disposed between the anode and the cathode may be formed using various methods, such as a vacuum evaporation method or a laser-induced thermal imaging (LITI) method. Recently, an inkjet printing method has been used to form the EML and the additional layer.

In general, the inkjet printing method may be a non-contact patterning technique of spraying a solution or a suspension as the type of droplets with a size of one to several tens of pico liter (pl) through fine nozzles. In the inkjet printing method, patterns may be freely printed at a resolution of several micrometers (mm). The inkjet printing method is currently being applied to a process of forming color filters and electrodes in the display fields of, such as plasma display panels (PDPs), liquid crystal displays (LCDs), and organic light emitting displays (OLEDs). Furthermore, the inkjet printing method is also being applied to flexible electronic devices and semiconductor circuits including electronic papers (E-papers) or radio-frequency identification (RFID).

SUMMARY OF CERTAIN INVENTIVE ASPECTS

The present disclosure provides a method of manufacturing an organic light emitting display apparatus using an inkjet printing method, by which a hole injection layer (HIL) of a substrate outer portion may be removed without damaging an opposing electrode.

According to an aspect of the present invention, there is provided a method of manufacturing an organic light emitting display apparatus, including: preparing a substrate having a pixel electrode and a pixel defining layer exposing the pixel electrode, forming an HIL on the substrate to cover the pixel electrode and the pixel defining layer, forming a primer layer on the HIL, patterning the primer layer to leave a region corresponding to at least a portion of the pixel electrode, removing a portion of the HIL to expose an outer portion of the substrate, forming a hole transport layer (HTL) on the patterned primer layer, and forming an opposing electrode to cover the EIL and the outer portion of the substrate.

The method may further include forming an emission layer (EML) on the HTL, forming an electron transport layer (ETL) on the substrate to cover the EML and forming an electron injection layer (EIL) on the ETL.

The substrate may have a central portion in which the pixel electrode and the pixel defining layer are formed and the outer portion surrounding the central portion.

The forming the HIL on the substrate may include forming the HIL on the central portion and the outer portion of the substrate.

The HIL may be formed using a slit coating process.

The patterning of the primer layer may be performed using a photolithography process.

The removing of the portion of the HIL may include removing the HIL formed on the outer portion of the substrate using a photolithography process to expose the outer portion of the substrate.

The HTL may be formed on the patterned primer layer using a nozzle printing process.

The EML may be formed on the HTL using an inkjet printing process.

The ETL and the EIL may not be formed on the outer portion of the substrate.

The ETL and the EIL may be formed using an open mask.

The substrate may have a central portion in which the pixel electrode and the pixel defining layer are formed and the outer portion surrounding the central portion, and the open mask may be opened to correspond to the central portion of the substrate and not opened to correspond to the outer portion of the substrate.

A thin film transistor (TFT) may be formed on the substrate and electrically connected to the pixel electrode.

According to another aspect of the present invention, there is provided a method of manufacturing an organic light emitting display apparatus. The method includes preparing a substrate having a central portion and an outer portion surrounding the central portion, forming a plurality of pixel electrodes and a pixel defining layer on the central portion of the substrate, the pixel defining layer exposing the pixel electrodes, forming an HIL on the substrate to expose the outer portion of the substrate and cover the pixel electrodes and the pixel defining layer formed on the central portion of the substrate, forming a primer layer on the HIL, patterning the primer layer to leave regions corresponding to at least a portion of the pixel electrodes, forming an HTL on the patterned primer layer, and forming an opposing electrode to cover the EIL and the outer portion of the substrate.

The HIL may be formed using a slit coating process.

The formation of the HIL may include disposing a shutter on the outer portion of the substrate not to form the HIL on the outer portion of the substrate.

The HTL and the EIL may not be formed on the outer portion of the substrate.

According to another aspect of the present invention, there is provided a method of manufacturing an organic light emitting display apparatus. The method includes preparing a substrate having a central portion and an outer portion surrounding the central portion, forming a plurality of pixel electrodes and a pixel defining layer on the central portion of the substrate, the pixel defining layer exposing the pixel electrodes, forming an HIL on the substrate to cover the pixel electrodes and the pixel defining layer and correspond to the central portion and outer portion of the substrate, exposing the outer portion of the substrate by removing the HIL from a region corresponding to the outer portion of the substrate, forming a primer layer on the HIL, patterning the primer layer to leave regions corresponding to at least a portion of the pixel electrodes, forming an HTL on the patterned primer layer, and forming an opposing electrode to cover the EIL and the outer portion of the substrate.

The exposing of the outer portion of the substrate may include forming photoresist on the HIL, disposing a mask corresponding to the central portion of the substrate on the photoresist, removing the photoresist from the outer portion of the substrate using an exposure process, and removing the mask and removing the HIL from the outer portion of the substrate to expose the outer portion of the substrate.

The removal of the HIL may be performed using an etching process.

BRIEF DESCRIPTION OF THE DRAWINGS

The above and other features and advantages of the present invention will become more apparent by describing in detail certain embodiments thereof with reference to the attached drawings in which.

DETAILED DESCRIPTION OF CERTAIN INVENTIVE EMBODIMENTS

The present invention is described more fully hereinafter with reference to the accompanying drawings, in which certain embodiments of the invention are shown. In the drawings, the shapes and sizes of layers and regions may be exaggerated for clarity. Like reference numerals generally refer to like elements throughout.

FIGS. 1 through 12 are diagrams of respective processes of a method of manufacturing an organic light emitting display apparatus according to an embodiment of the present invention.

Figure 1:
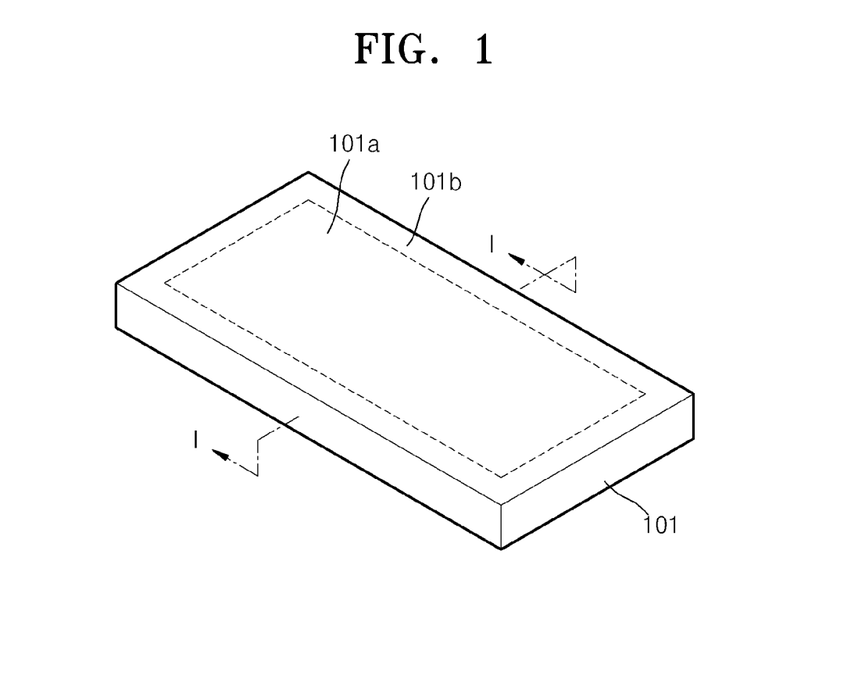
FIGS. 1 through 12 are diagrams of respective processes of a method of manufacturing an organic light emitting display apparatus according to an embodiment of the present invention.
Figure 2:
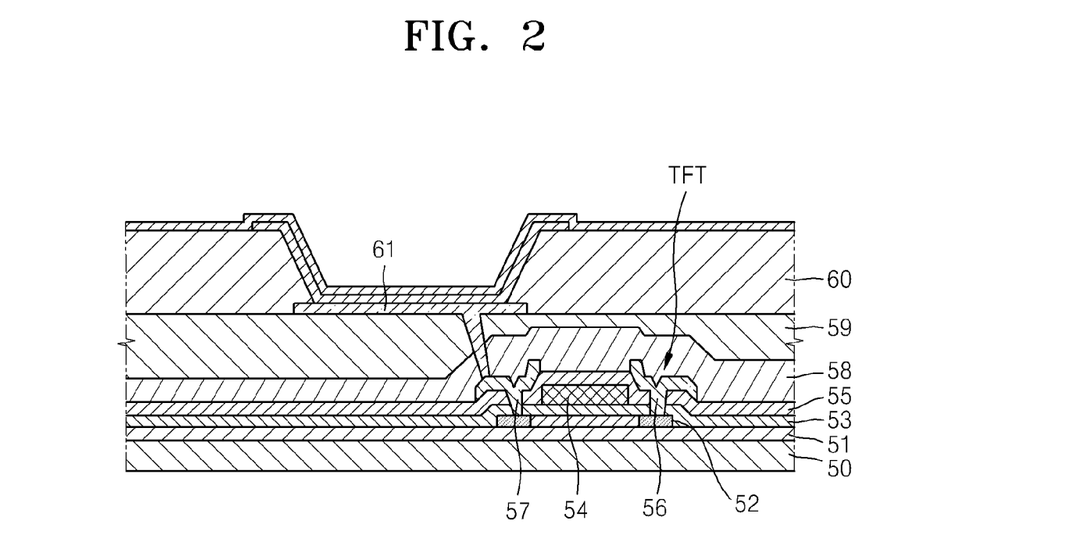

A substrate 101 having a pixel electrode and a pixel defining layer exposing the pixel electrode may be prepared as shown in FIG. 1. FIG. 2 is a cross-sectional view taken along a line I-I of FIG. 1.

Referring to FIGS. 1 and 2, a lower substrate (refer to 50 in FIG. 2) may include a central portion and an outer portion. The central portion refers to a central region of the lower substrate 50, and the outer portion refers to an edge of the lower substrate 50, which surrounds the central portion. As shown in FIG. 2, a plurality of thin film transistors (TFTs), the pixel electrode, and the pixel defining layer may be prepared in the central portion of the lower substrate 50. Thereafter, a connector or interconnections, which may be in contact with an opposing electrode, may be disposed in the outer portion of the lower substrate 50.

The substrate 101 will now be described in detail with reference to FIG. 2. The lower substrate 50 may be formed of a transparent material, such as, for example, glass, plastic, or a metal. An insulating layer 51, such as, for example, a buffer layer, may be formed on the entire surface of the lower substrate 50.

A TFT, a pixel electrode 61, and a pixel defining layer 60 may be formed on the insulating layer 51.

A semiconductor active layer 52 having a predetermined pattern may be formed on a front surface of the insulating layer 51. The semiconductor active layer 52 may be buried by a gate insulating layer 53. The semiconductor active layer 52 may include a p-type or n-type semiconductor.

A gate electrode 54 of the TFT may be formed on a front surface of the gate insulating layer 53 in a position corresponding to the semiconductor active layer 52. Also, an interlayer insulating layer 55 may be formed to cover the gate electrode 54. Thereafter, the gate insulating layer 53 and the interlayer insulating layer 55 may be etched using, for example, a dry etching process to form a contact hole exposing a portion of the semiconductor active layer 52.

Next, source and drain electrodes 56 and 57 may be formed on the interlayer insulating layer 55 and in contact with the exposed semiconductor active layer 52 through the contact hole. A protection layer 58 may be formed to cover the source and drain electrodes 56 and 57, and etched to expose a portion of the drain electrode 57. An additional insulating layer 59 may be further formed on the protection layer 58 to planarize the protection layer 58.

The pixel electrode 61 is formed on the protection layer 58. The pixel electrode 61 may be electrically connected to the drain electrode 57 of the TFT.

Furthermore, the pixel defining layer 60 may be formed to cover the pixel electrode 61. After a predetermined opening is formed in the pixel defining layer 60 so that at least a portion of the pixel electrode 61 is exposed, an organic layer including an emission layer (EML) may be formed in a region defined by the opening as shown in FIGS. 3 through 11. In addition, as shown in FIG. 12, an opposing electrode (refer to 108 in FIG. 12) may be formed on the organic layer.

The pixel defining layer 60, which may partition respective pixels, may be formed of an organic material and planarize the surface of the lower substrate 50 having the pixel electrode 61, particularly, the surface of the additional insulating layer 59.

The pixel electrode 61 may serve as an anode, and the below described opposing electrode (refer to 108 in FIG. 12) may serve as a cathode. In another embodiment, the pixel electrode 61 may serve as a cathode, and the opposing electrode 108 may serve as an anode. The pixel electrode 61 may be patterned to correspond to each of the pixels, and the opposing electrode 108 may be formed to cover all the pixels.

The pixel electrode 61 may include a transparent electrode or a reflective electrode. When the pixel electrode 61 includes the transparent electrode, the pixel electrode 61 may include one or more of indium tin oxide (ITO), indium zinc oxide (IZO), ZnO, or indium oxide ($In_2O_3$). When the pixel electrode 61 includes the reflective electrode, the pixel electrode 61 may include a reflective layer and a transparent electrode layer formed on the reflective layer. The reflective layer may be formed of one or more of silver(Ag), magnesium(Mg), aluminium(Al), platinum(Pt), palladium(Pd), gold(Au), nickel(Ni), neodymium(Nd), iridium(Ir), chromium(Cr), or a compound thereof, and the transparent electrode layer may be formed of ITO, IZO, ZnO, or $In_2O_3$. The formation of the pixel electrode 61 may include forming a layer using a sputtering process and patterning the formed layer using a photolithography process, for example.

FIGS. 3 through 11 are cross-sectional views of respective process operations of a method of forming an organic layer including an emission layer.

Figure 3:
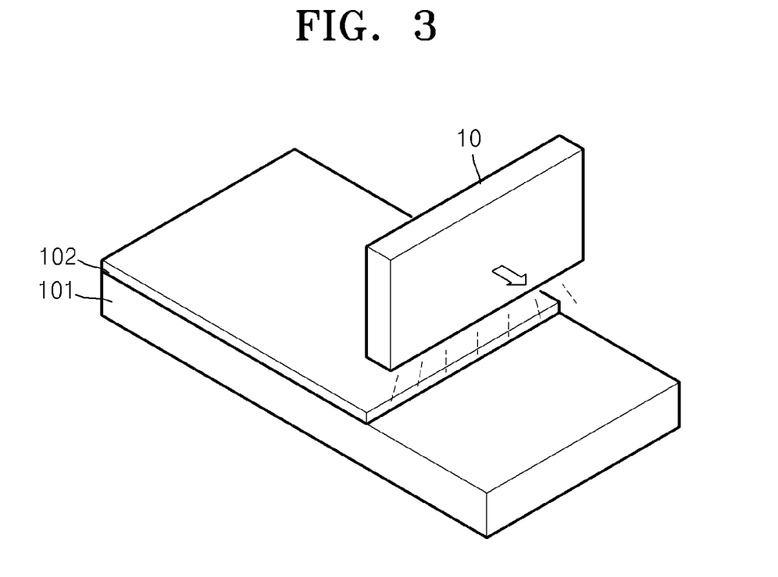

Referring to FIG. 3, a hole injection layer (HIL) 102 may be formed on a substrate 101.

The HIL 102 may be formed on the substrate 101 using a slit coating method. As shown in FIG. 3, a slit coater 10 may be formed on the substrate 101. While moving over the substrate 101, the slit coater 10 may jet an HIL forming material on the substrate 101 so that the HIL 102 can be formed on the substrate 101. The HIL 102 may be formed to cover both a central portion 101a and an outer portion 101b of the substrate 101.

Figure 4:
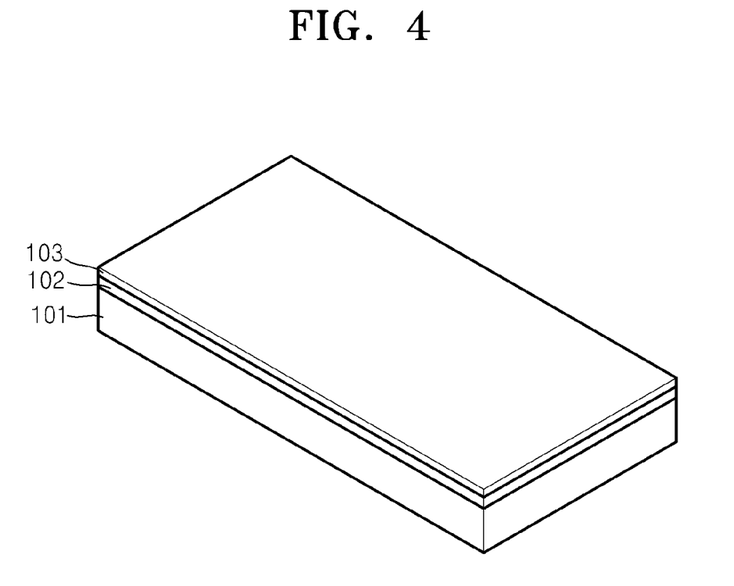

Next, referring to FIG. 4, a primer layer 103 may be formed on the HIL 102. The primer layer 103 may improve the wetting of the underlying HIL 102 and facilitate uniform formation of a hole transport layer (refer to 105 in FIG. 9) and emission layers (EMLs) (refer to 106R, 106G, and 106G of FIG. 10). The primer layer 103 may be formed using a slit coating process.

Figure 5:
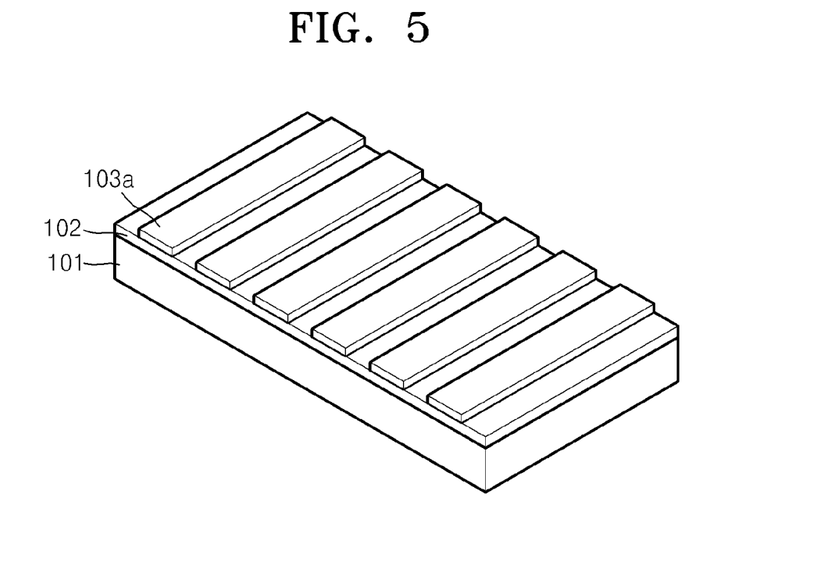

Referring to FIG. 5, a patterned primer layer 103a may be formed. Specifically, the primer layer 103 formed to cover the HIL 102 as shown in FIG. 4 may be patterned to form the patterned primer layer 103a as shown in FIG. 5. The primer layer 103 may be patterned to leave a region corresponding to at least a portion of a pixel electrode (refer to 61 in FIG. 2). Accordingly, the pixel electrode 61 may be disposed under the patterned primer layer 103a. The primer layer 103 may be patterned using a photolithography process.

Figure 6:
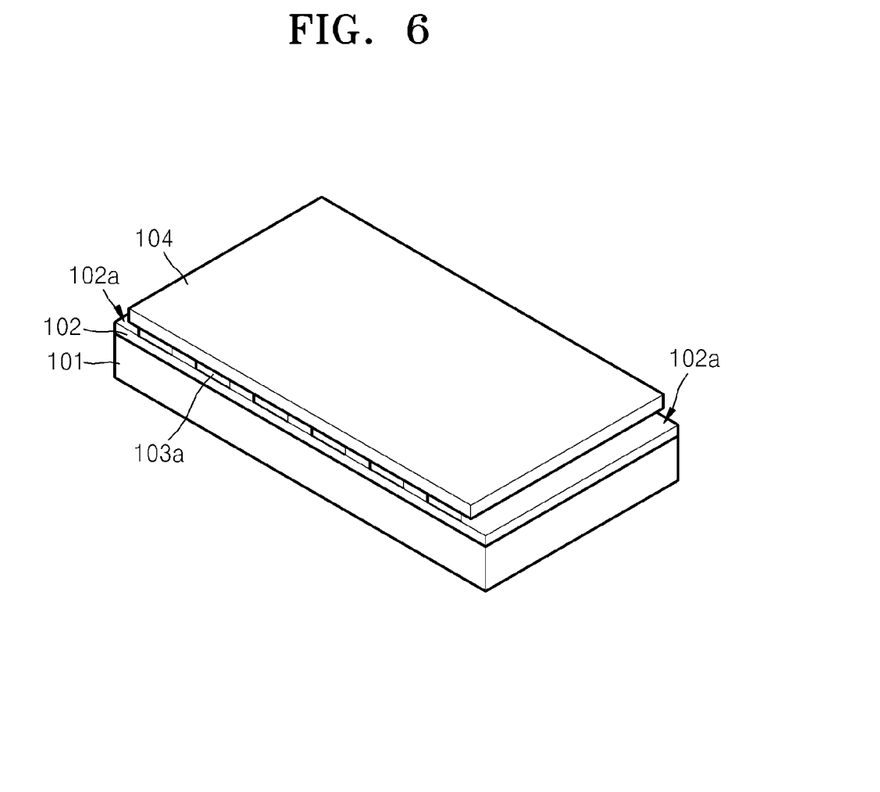
Figure 7:
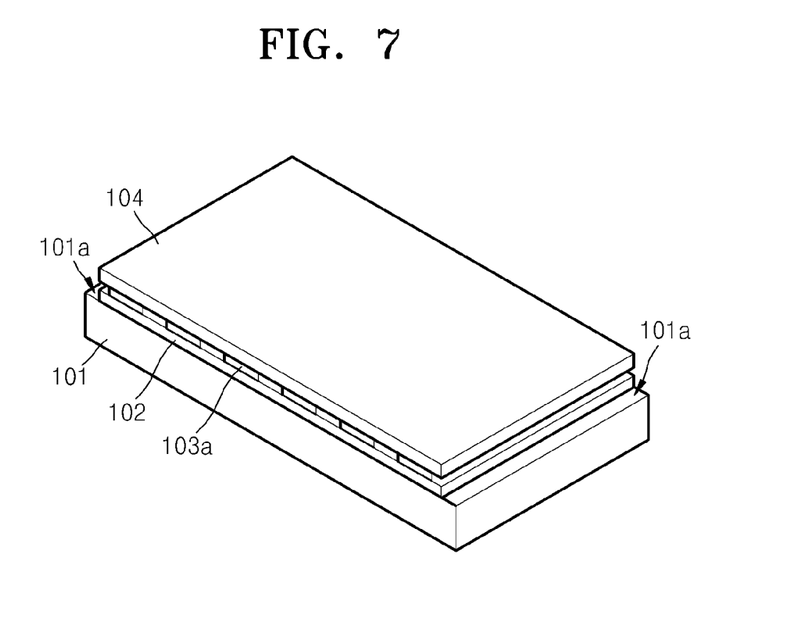
Figure 8:
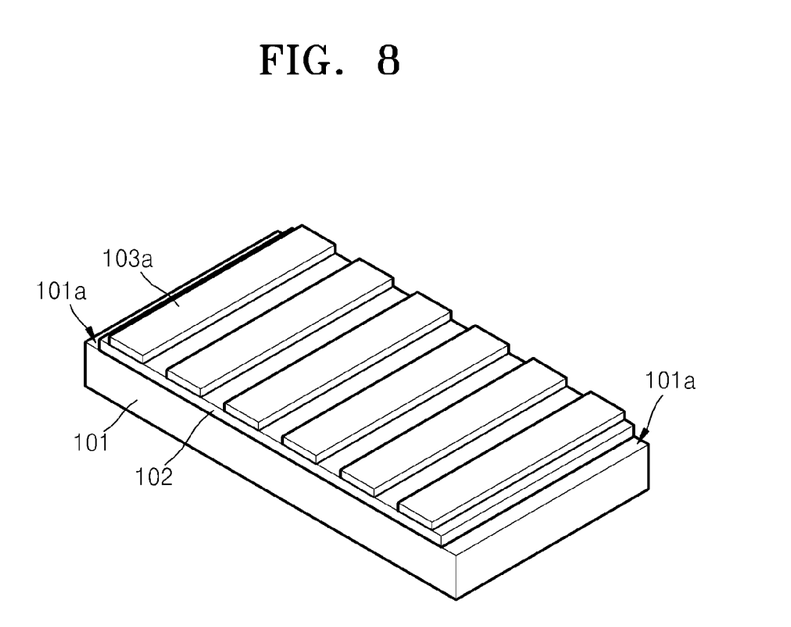

Thereafter, referring to FIGS. 6 through 8, a portion 102a of the HIL 102 formed on the outer portion (refer to 101a of FIG. 7) of the substrate 101 may be removed. The portion 102a of the HIL 102 may be removed using a photolithography process.

More specifically, referring to FIG. 6, photoresist 104 may be formed on the substrate 101 to cover the patterned primer layer 103a. Although the photoresist 104 covers the entire patterned primer layer 103a, the photoresist 104 may not be formed on the portion 102a of the HIL 102 formed on the outer portion (refer to 101a in FIG. 7) of the substrate 101.

Next, as shown in FIG. 7, the exposed portion 102a of the HIL 102 may be removed. The removal of the portion 102a of the HIL 102 may be performed using an etching process. Since the portion 102a of the HIL 102 is not covered with the photoresist 104 but externally exposed, the portion 102a of the HIL 102 may be removed using an etchant.

Thereafter, as shown in FIG. 8, the photoresist (refer to 104 in FIG. 4) may be removed. The patterned primer layer 103a may be externally exposed by removing the photoresist 104.

Figure 9:
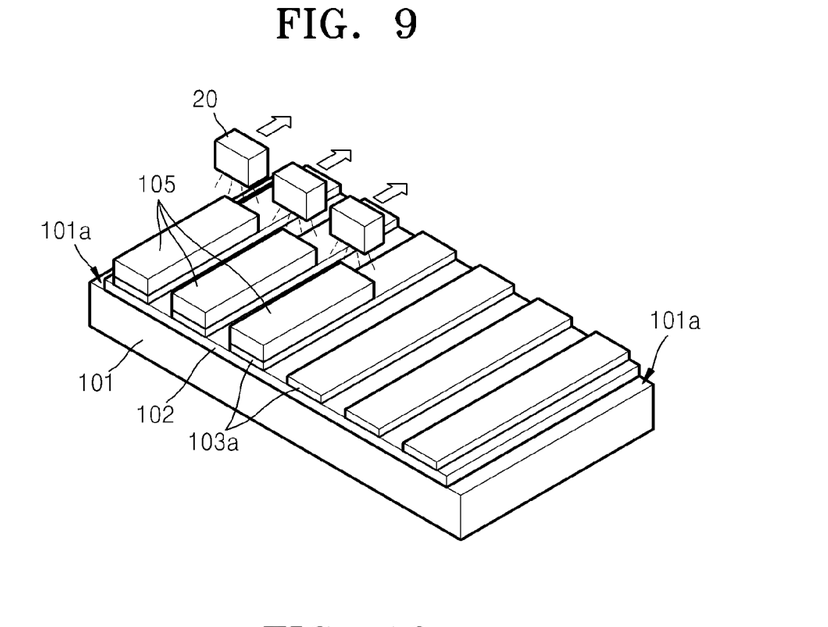

Next, as shown in FIG. 9, a hole transport layer (HTL) 105 may be formed on the patterned primer layer 103a. The HTL 105 may be formed using a nozzle printing process. Nozzle heads 20 may be disposed on the patterned primer layer 103a. While the nozzle heads 20 are moving along a direction in which the patterned primer layer 103a is formed, the HTL 105 may be formed on the patterned primer layer 103a. In a modified example, while the substrate 101 is moving with respect to the nozzle heads 20, the HTL 105 may be formed on the patterned primer layer 103a.

Figure 10:
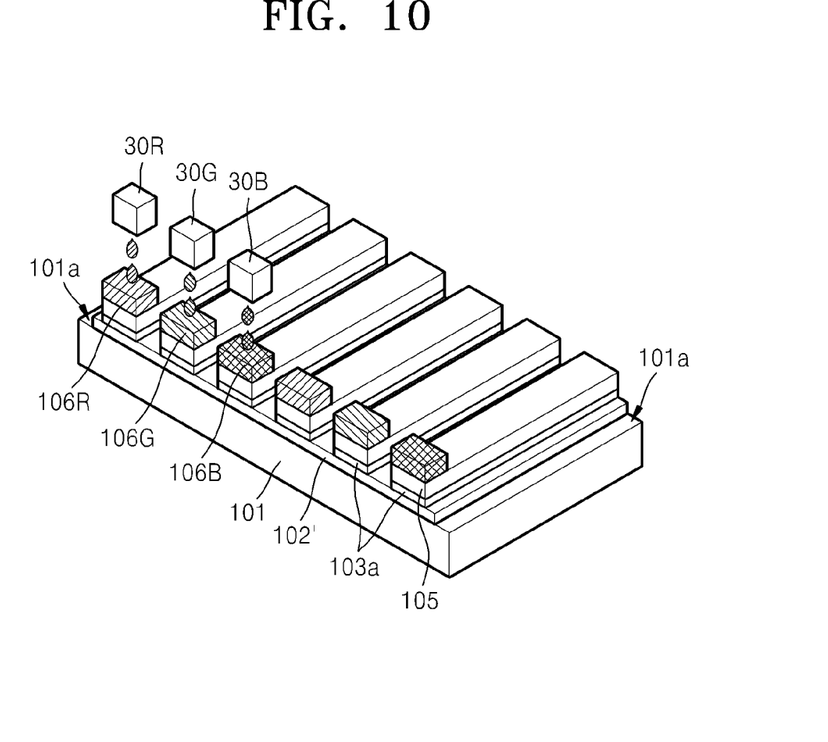

Next, as shown in FIG. 10, EMLs 106R, 106G, and 106B may be formed on the HTL 105. The EMLs 106R, 106G, and 106B may be formed using an inkjet printing process. Inkjet heads 30R, 30G, and 30B may be aligned and disposed on the HTL 105. While the inkjet heads 30R, 30G, and 30B are moving on the HTL 105, materials forming the EMLs 106R, 106G, and 106B may be jetted toward the HTL 105.

Figure 11:
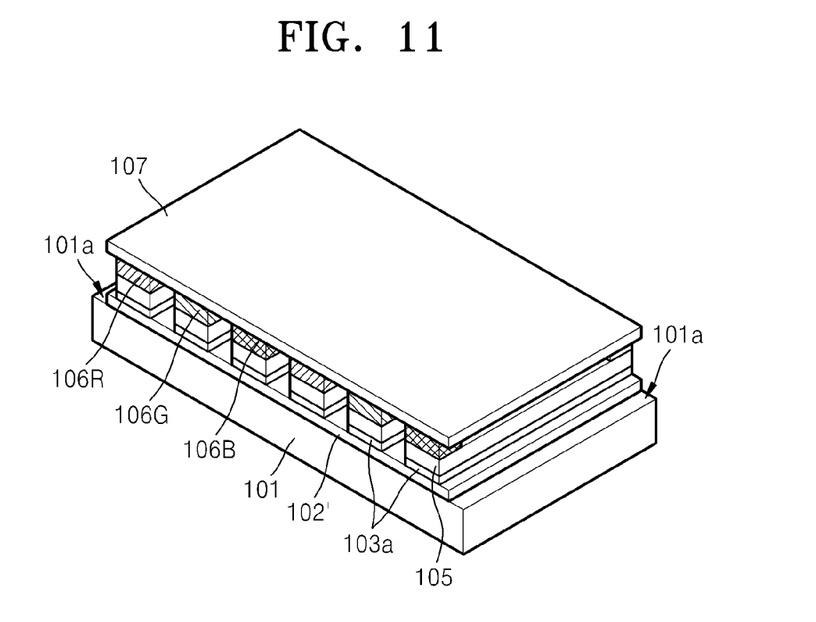
Figure 12:
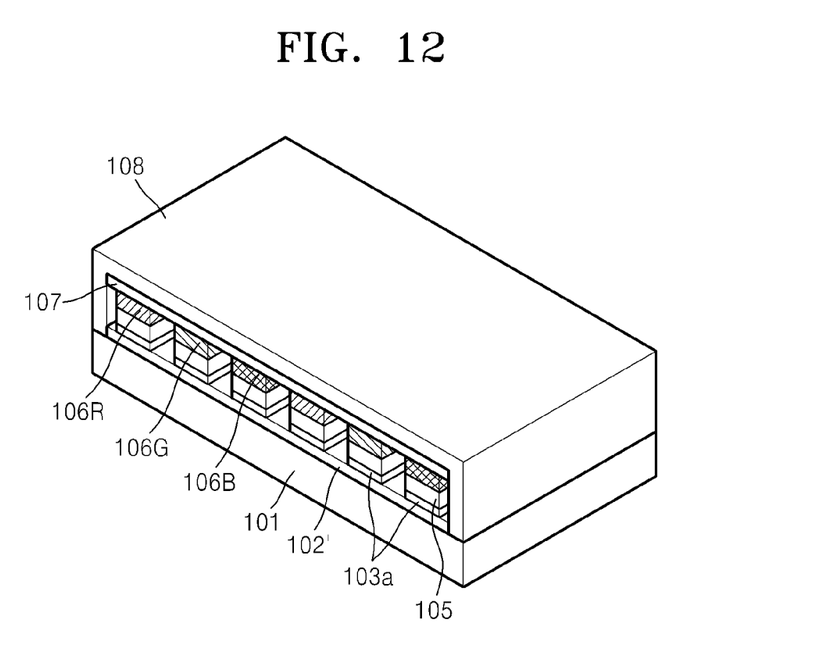

Next, as shown in FIG. 11, an electron transport layer (ETL) 107 may be formed on the substrate 101 to cover the EMLs 106R, 106G, and 106B. The ETL 107 may be formed on the substrate 101 using an open mask (not shown). The open mask may have an opening corresponding to an HIL 102', and an opening corresponding to the outer portion 101a of the substrate 101 may not be formed. When the open mask is disposed on the substrate 101 and the ETL 107 is formed, although the ETL 107 may be formed on the substrate 101 to cover all the EMLs 106R, 106G, and 106B, the ETL 107 may not be formed on the outer portion 101a of the substrate 101.

Although not shown in the drawings, an electron injection layer (EIL) (not shown) may be formed on the ETL 107. The EIL may also be formed on the ETL 107 using an open mask. Similarly, the open mask used to form the EIL may not be formed on the outer portion 101a of the substrate 101, so that the EIL may not be formed on the outer portion 101a of the substrate 101.

Next, as shown in FIG. 12, the opposing electrode 108 may be formed. The opposing electrode 108 may be formed to cover the ETL 107 and the outer portion 101a of the substrate 101. A pad electrode to which external power is applied may be formed on the outer portion 101a of the substrate 101. The opposing electrode 108 may be in contact with the outer portion 101a of the substrate 101 so that a voltage can be applied to the opposing electrode 108.

The opposing electrode 108 may include a transparent electrode or a reflective electrode. When the opposing electrode 108 includes a transparent electrode, the opposing electrode 108 may be used as a cathode. Thus, the formation of the opposing electrode 108 may include depositing a metal having a small work function toward the EMLs 106R, 106G, and 106B and forming a subsidiary electrode layer or a bus electrode line on the deposited metal. The metal having the small work function may be at least one of lithium(Li), calcium (Ca), Lithium fluoride/calcium (LiF/Ca), lithium fluoride/aluminum (LiF/Al), Al, Ag, Mg, or a compound thereof. The subsidiary electrode layer or the bus electrode line may be formed of at least one of ITO, IZO, ZnO, or $In_2O_3$. Also, when the opposing electrode 108 includes the reflective electrode, the opposing electrode 108 may be formed by depositing at least one of Li, Ca, LiF/Ca, LiF/Al, Al, Ag, Mg, or a compound thereof Conventionally, an organic material formed on an outer portion of a substrate was removed using an opposing electrode. When the organic material formed on the outer portion of the substrate was etched using the opposing electrode as a mask, damage was applied to the opposing electrode, and the EML disposed under the opposing electrode was affected. Thus, an energy level of the EML was changed or a leakage current flowed.

In recent years, the scaling-up of display devices has occurred, and large-sized organic light emitting display apparatuses have been fabricated as a top-emitting type to improve an aperture ratio. Also, a top-emitting organic light emitting display apparatus may include an opposing electrode 108 formed using a transparent conductive material, such as Mg—Ag. However, Mg—Ag may react with $O_2$ gas and F gas, which are used during the etching of an organic material, and apply damage to the opposing electrode 108.

However, in the method of manufacturing the organic light emitting display apparatus according to embodiments of the present invention, the organic material formed on the outer portion 101a of the substrate 101 may be removed before forming the EMLs 106R, 106G, and 106B and the opposing electrode 108, so that damage to the EMLs 106R, 106G, and 106B and the opposing electrode 108 can be prevented.

Figure 13:
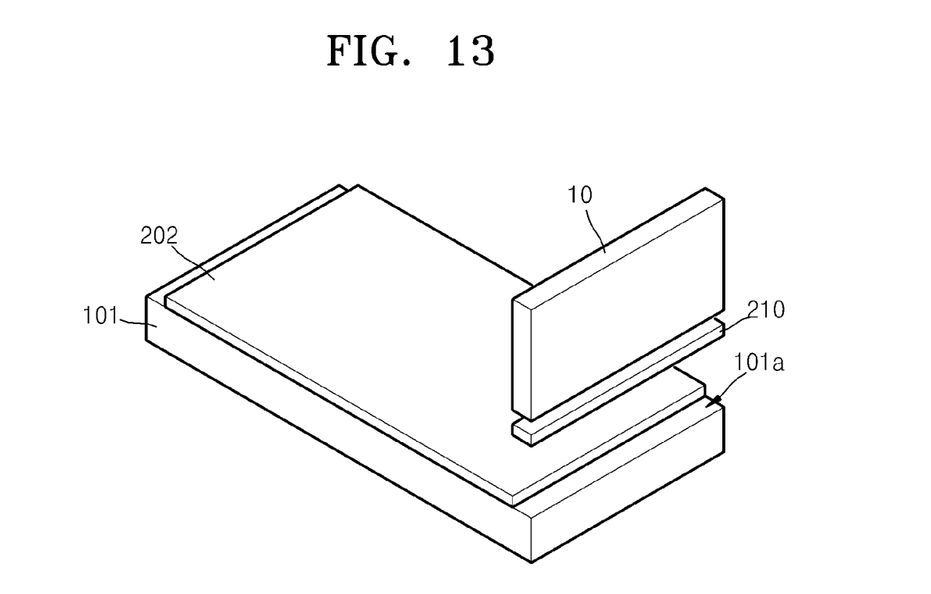
FIGS. 13 and 14 are perspective views of some processes of a method of manufacturing an organic light emitting display apparatus according to another embodiment of the present invention.
Figure 14:
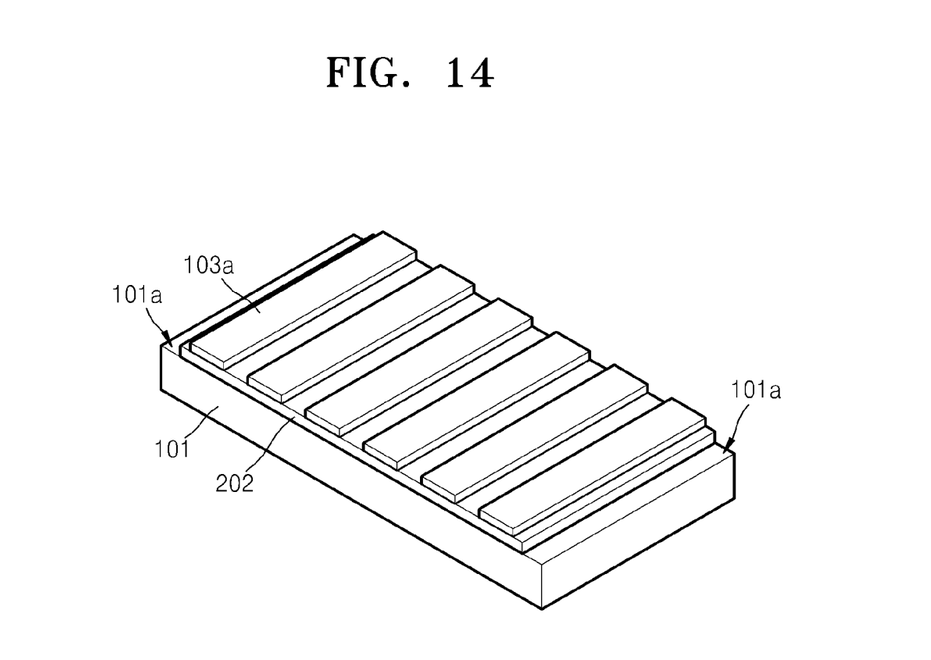

FIGS. 13 and 14 are perspective views of some processes of a method of manufacturing an organic light emitting display apparatus according to another embodiment of the present invention.

The method of manufacturing the organic light emitting display apparatus according to the present embodiment differs from the method of manufacturing the organic light emitting display apparatus described above with reference to FIGS. 1 through 12 in terms of a method of forming an HIL 202. Specifically, a process of forming a substrate 101 by forming a TFT, a pixel electrode, and a pixel defining layer on a lower substrate (refer to 50 in FIG. 2) may be the same as in the method of manufacturing the organic light emitting display apparatus described with reference to FIG. 1. However, in the method described with reference to FIGS. 1 through 12, after the HIL 102 is formed on the entire surface of the substrate 101, the portion 102a of the HIL 102 may be removed from the outer portion 101a of the substrate 101. By comparison, in the present embodiment, an outer portion 101a of the substrate 101 may be exposed using a shutter 210 during formation of an HIL 202 on the substrate 101. Before a slit coater 10 is disposed on the substrate 101, the shutter 210 may be disposed on the outer portion 101a of the substrate 101. While the slit coater 10 is moving on the substrate 101, the HIL 202 may be formed on the substrate 101. However, since the shutter 210 is disposed on the outer portion 101a of the substrate 101, an HIL forming material jetted by the slit coater 10 may be blocked by the shutter 10. Thus, the HIL 202 may not be formed on the outer portion 101a of the substrate 101.

After forming the HIL 202, a patterned primer layer 103a may be formed on the HIL 202 as shown in FIG. 14.

Processes of forming the layers from the patterned primer layer 103a through the opposing electrode 108 may be the same as in the method of manufacturing the organic light emitting display apparatus described with reference to FIGS. 1 through 12.

FIGS. 15 through 19 are perspective views of some process operations of a method of manufacturing an organic light emitting display apparatus according to another embodiment of the present invention.

The method of manufacturing the organic light emitting display apparatus according to the present embodiment differs from the method of manufacturing the OLED display device described with reference to FIGS. 1 through 12. Specifically, a process of forming a substrate 101 by forming a TFT, a pixel electrode, and a pixel defining layer on a lower substrate (refer to 50 in FIG. 2) may be the same as in the method of manufacturing the organic light emitting display apparatus described with reference to FIG. 1. However, in the method described with reference to FIGS. 1 through 12, after the HIL 102 is formed on the entire surface of the substrate 101 and the patterned primer layer 103a is formed, the portion 102a of the HIL 102 may be removed from the outer portion 101a of the substrate 101. By comparison, in the present embodiment, a portion 302a of an HIL 302 may be removed after the HIL 302 is formed on the substrate 101 and before a primer layer 103 is formed.

Figure 15:
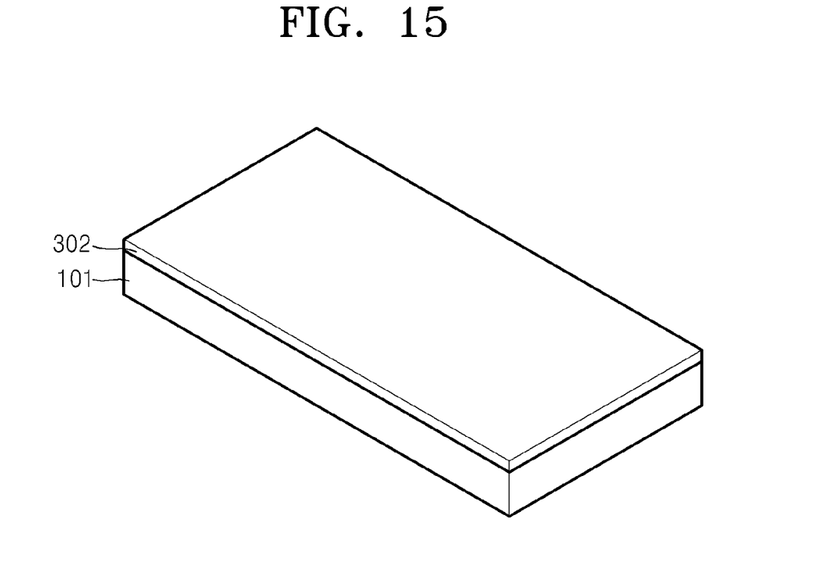
FIGS. 15 through 19 are perspective views of some processes of a method of manufacturing an organic light emitting display apparatus according to another embodiment of the present invention.

More specifically, the HIL 302 may be formed on the entire surface of the substrate 101 as shown in FIG. 15.

Figure 16:
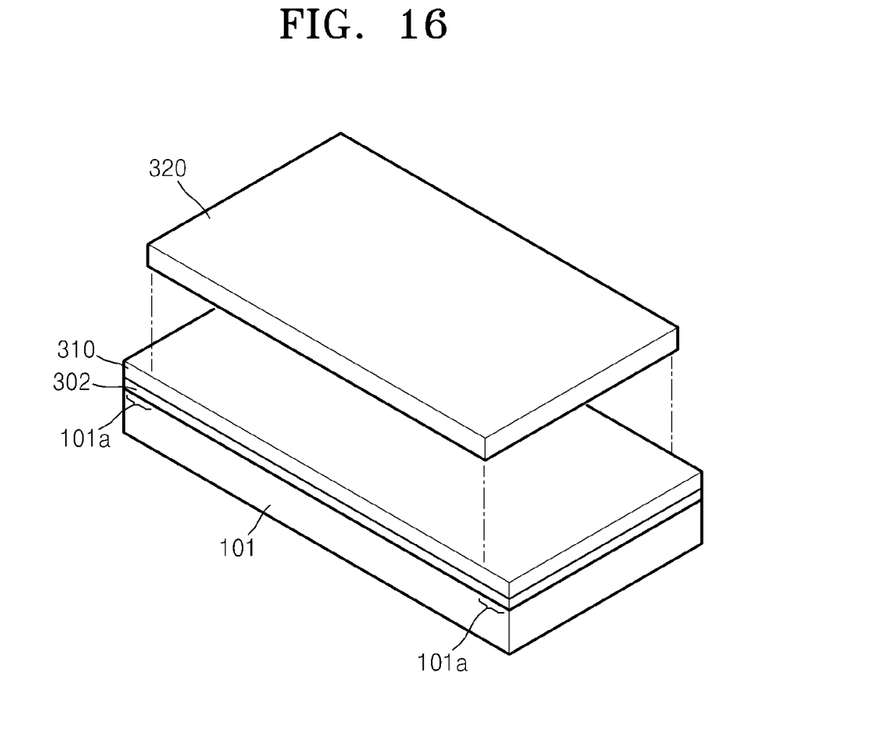

Next, as shown in FIG. 16, photoresist 310 may be formed on the entire surface of the HIL 302, and a mask 320 may be disposed on the photoresist 310. The mask 320 may have a size corresponding to a central portion 101b of the substrate 101. The mask 320 may be disposed on the central portion 101b of the substrate 101 and not on an outer portion 101a of the substrate 101.

Figure 17:
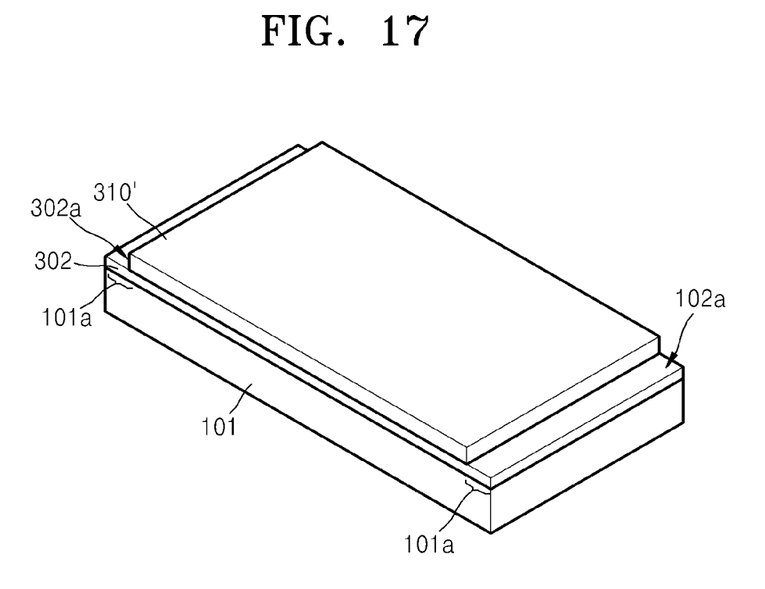

Subsequently, as shown in FIG. 17, the photoresist 310 may be removed from the outer portion 101a of the substrate 101 using an exposure process. Thus, a portion 302a of the HIL 302 may be exposed on the outer portion 101a of the substrate 101.

Figure 18:
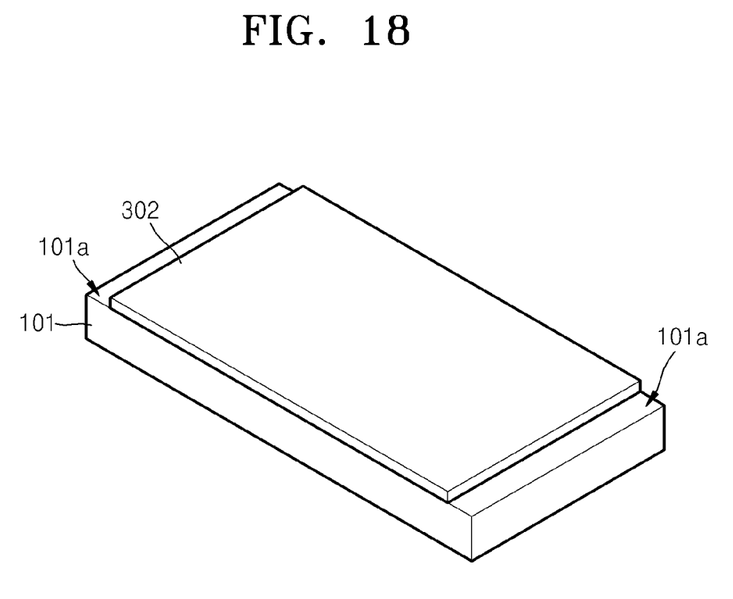
Figure 19:
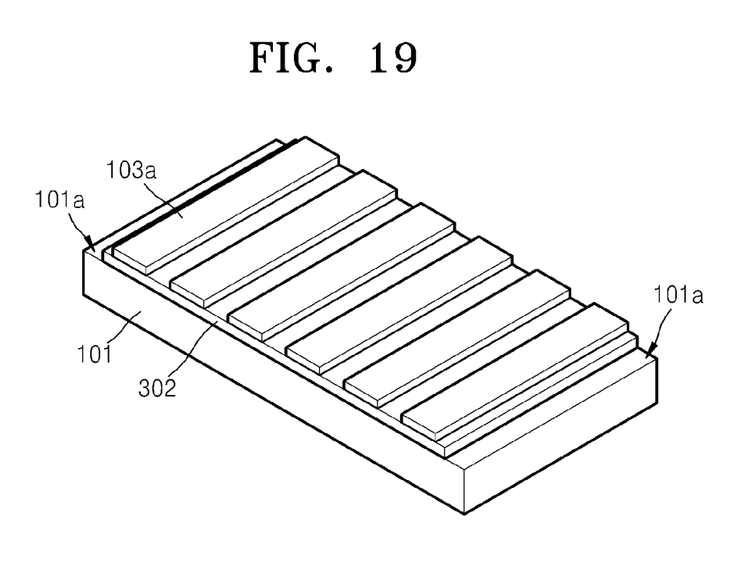

Next, as shown in FIG. 18, the portion 302a of the HIL 302 may be removed from the outer portion 101a of the substrate 101, and the photoresist 310 may be removed from the central portion 101b of the substrate 101. The portion 302a of the HIL 302 may be removed by etching from the outer portion 101a of the substrate 101.

Processes of forming a patterned primer layer 103a through an opposing electrode 108 are the same as in the method of manufacturing the organic light emitting display apparatus described with reference to FIGS. 1 through 12.

According to embodiments of the present invention, an HIL can be removed from an outer portion of a substrate without damaging an opposing electrode.

While the present invention has been particularly shown and described with reference to certain embodiments thereof, it will be understood by those of ordinary skill in the art that various changes in form and details may be made therein without departing from the spirit and scope of the present invention as defined by the following claims.

What is claimed is:

1. A method of manufacturing an organic light emitting display apparatus, comprising:
preparing a substrate having a pixel electrode and a pixel defining layer exposing the pixel electrode;
forming a hole injection layer (HIL) on the substrate to cover the pixel electrode and the pixel defining layer;
forming a primer layer on the HIL;
patterning the primer layer to leave a region corresponding to at least a portion of the pixel electrode;
removing a portion of the HIL to expose an outer portion of the substrate; and
forming an opposing electrode to cover the HIL and the outer portion of the substrate.

2. The method of claim 1, further comprising:
forming a hole transport layer (HTL) on the patterned primer layer;
forming an emission layer (EML) on the HTL;
forming an electron transport layer (ETL) on the substrate to cover the EML; and
forming an electron injection layer (EIL) on the ETL.

3. The method of claim 1, wherein the substrate has a central portion in which the pixel electrode and the pixel defining layer are formed and the outer portion surrounding the central portion.

4. The method of claim 3, wherein the forming the HIL on the substrate comprises forming the HIL on the central portion and the outer portion of the substrate.

5. The method of claim 1, wherein the HIL is formed using a slit coating process.

6. The method of claim 1, wherein the patterning of the primer layer is performed using a photolithography process.

7. The method of claim 1, wherein the removing of the portion of the HIL comprises removing the HIL formed on the outer portion of the substrate using a photolithography process to expose the outer portion of the substrate.

8. The method of claim 2, wherein the HTL is formed on the patterned primer layer using a nozzle printing process.

9. The method of claim 2, wherein the EML is formed on the HTL using an inkjet printing process.

10. The method of claim 2, wherein the ETL and the EIL are not formed on the outer portion of the substrate.

11. The method of claim 2, wherein the ETL and the EIL are formed using an open mask.

12. The method of claim 11, wherein the substrate has a central portion in which the pixel electrode and the pixel defining layer are formed and the outer portion surrounding the central portion, and the open mask is opened to correspond to the central portion of the substrate and not opened to correspond to the outer portion of the substrate.

13. The method of claim 1, wherein a thin film transistor (TFT) is formed on the substrate and electrically connected to the pixel electrode.

14. A method of manufacturing an organic light emitting display apparatus, the method comprising:
preparing a substrate having a central portion and an outer portion surrounding the central portion;
forming a plurality of pixel electrodes and a pixel defining layer on the central portion of the substrate, the pixel defining layer exposing the pixel electrodes;
forming an HIL on the substrate to expose the outer portion of the substrate and cover the pixel electrodes and the pixel defining layer formed on the central portion of the substrate;
forming a primer layer on the HIL;
patterning the primer layer to leave regions corresponding to at least a portion of the pixel electrodes; and
forming an opposing electrode to cover the HIL and the outer portion of the substrate.

15. The method of claim 14, further comprising:
forming an HTL on the patterned primer layer;
forming an EML on the HTL;
forming an ETL on the substrate to cover the EML; and
forming an EIL on the ETL.

16. The method of claim 14, wherein the HIL is formed using a slit coating process.

17. The method of claim 15, wherein the HTL and the EIL are not formed on the outer portion of the substrate.

18. The method of claim 16, wherein the forming of the HIL comprises disposing a shutter on the outer portion of the substrate not to form the HIL on the outer portion of the substrate.

19. A method of manufacturing an organic light emitting display apparatus, the method comprising:
preparing a substrate having a central portion and an outer portion surrounding the central portion;
forming a plurality of pixel electrodes and a pixel defining layer on the central portion of the substrate, the pixel defining layer exposing the pixel electrodes;
forming an HIL on the substrate to cover the pixel electrodes and the pixel defining layer and correspond to the central portion and outer portion of the substrate;
exposing the outer portion of the substrate by removing the HIL from a region corresponding to the outer portion of the substrate;
forming a primer layer on the HIL;
patterning the primer layer to leave regions corresponding to at least a portion of the pixel electrodes; and
forming an opposing electrode to cover the EIL and the outer portion of the substrate.

20. The method of claim 19, wherein the exposing of the outer portion of the substrate comprises:
forming photoresist on the HIL;
disposing a mask corresponding to the central portion of the substrate on the photoresist;
removing the photoresist from the outer portion of the substrate using an exposure process; and
removing the mask and removing the HIL from the outer portion of the substrate to expose the outer portion of the substrate.

21. The method of claim 20, wherein the removing of the HIL is performed using an etching process.

* * * * *